United States Patent [19]

Marcus et al.

[11] 4,342,936

[45] Aug. 3, 1982

[54] HIGH DEFLECTION BANDWIDTH PRODUCT POLYMERIC PIEZOELECTRIC FLEXURE MODE DEVICE AND METHOD OF MAKING SAME

[75] Inventors: Michael A. Marcus, Fairport; James K. Lee, Pittsford, both of N.Y.

[73] Assignee: Eastman Kodak Company, Rochester, N.Y.

[21] Appl. No.: 218,591

[22] Filed: Dec. 19, 1980

[51] Int. Cl.³ .................................. H01L 41/08
[52] U.S. Cl. ................................ 310/330; 29/25.35; 310/800
[58] Field of Search .................. 310/330–332, 310/363, 357, 800; 29/25.35

[56] References Cited

U.S. PATENT DOCUMENTS

| | | | |
|---|---|---|---|
| 2,478,223 | 8/1949 | Argabrite | 310/330 X |
| 3,500,451 | 3/1970 | Yando | 310/330 |
| 3,798,473 | 3/1974 | Murayama | 310/8 |
| 3,912,830 | 10/1975 | Murayama et al. | 427/100 |
| 4,180,602 | 12/1979 | Schiavone | 427/306 |
| 4,190,785 | 2/1980 | Kompanek | 310/330 |

OTHER PUBLICATIONS

Article by C. P. Germano, "Flexure Mode Piezoelectric Transducers", IEEE Transactions on Audio and Electroacoustics, vol. AU-19, No. 1, March, 1971.

*Primary Examiner*—Mark O. Budd
*Attorney, Agent, or Firm*—Thomas H. Close

[57] ABSTRACT

A piezoelectric flexure mode device comprises: a sheet of polymeric piezoelectric material, poled in a direction parallel with the thickness of the sheet; a relatively thin electrode, being less than about 1% of the total thickness of the device, bonded to one side of the sheet; and a relatively thick electrode, being between about 2% and about 35% of the total thickness of the device, bonded to the other side of the sheet. The second electrode is of a thickness sufficient to substantially maximize a figure of merit, called Deflection Bandwidth Product, representing the deflection of the device times the first resonant frequency of the device, thereby providing a flexure mode device capable of large rapid deflections.

15 Claims, 2 Drawing Figures

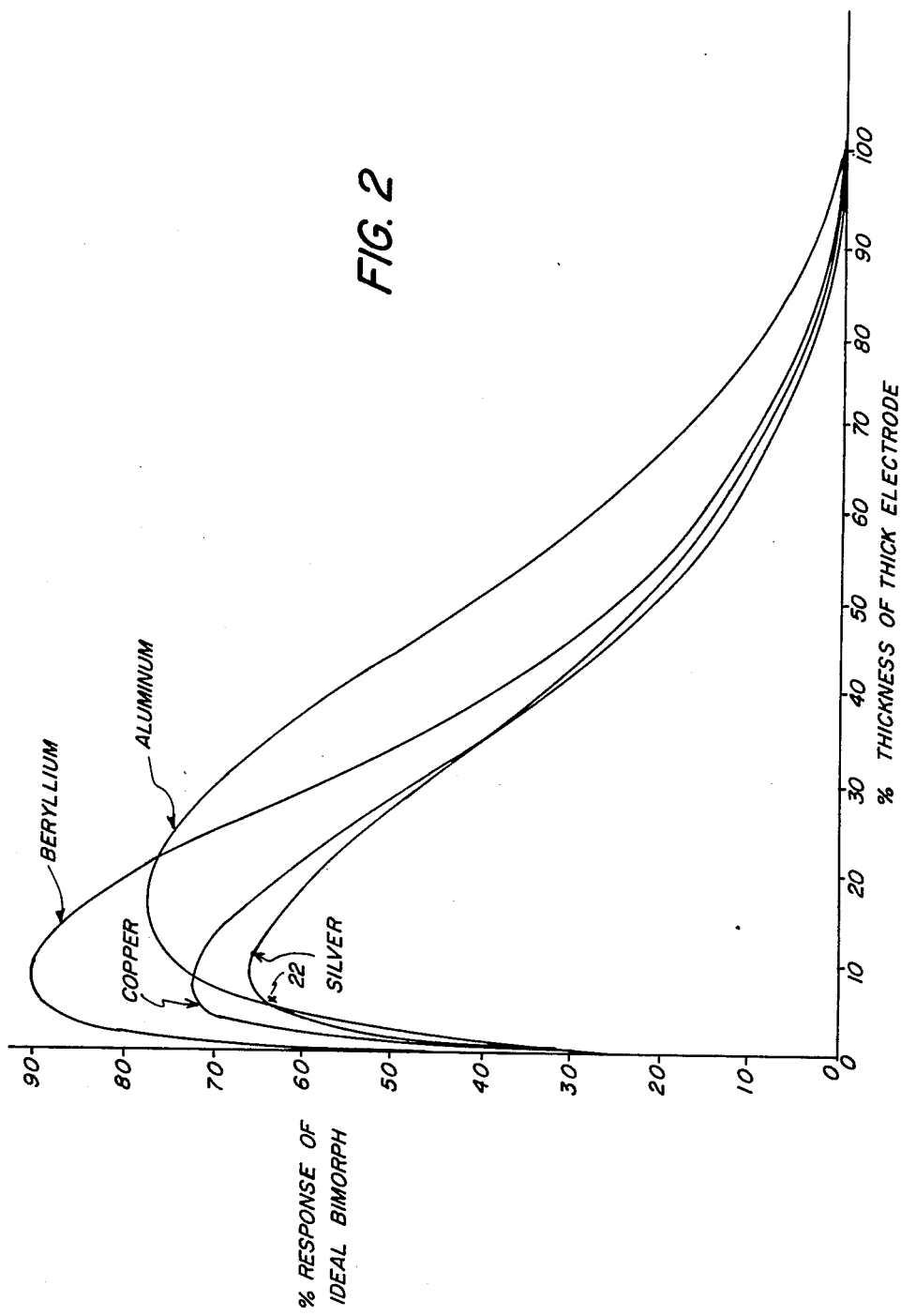

HIGH DEFLECTION BANDWIDTH PRODUCT POLYMERIC PIEZOELECTRIC FLEXURE MODE DEVICE AND METHOD OF MAKING SAME

BACKGROUND OF THE INVENTION

1. Field of the Invention

The present invention relates in general to piezoelectric flexure mode devices, and more particularly to such a device (called a "unimorph") comprising a layer of piezoelectrically active material bonded to a layer of piezoelectrically inactive material.

2. Discussion Related to the Problem

A piezoelectric flexure mode device comprises a plurality of layers of material of differing piezoelectric activity. Under the application of an electric field across the thickness of such a device, small differences in the amounts of expansion or contraction in the planes of the different layers are converted into large deflections of the layers out of their planes. Alternatively, if an external force is applied to the device, causing it to flex, a voltage is generated across the layers of the device. Piezoelectric flexure mode devices have found utility as electrical-to-mechanical and mechanical-to-electrical transducers in such diverse applications as speakers, microphones, phonograph cartridges, motors, and accelerometers.

In its simplest form, a piezoelectric flexure mode device comprises a structure of two layers bonded together, one of the layers exhibiting piezoelectric activity, and the other not. In the presence of an electric field (generally applied by means of electrodes fixed to the top and bottom surfaces of the device), the piezoelectric layer expands or contracts in its own plane, and because the other layer, which is not piezoelectrically active, resists the expansion or contraction at the bonded interface between the two layers, the device flexes or bends. This form of flexure mode device is known as a "unimorph", and in a common embodiment comprises a slab of piezoelectric ceramic material, such as lead zirconate titanate (PZT), cemented to a sheet of metal such as brass or copper. The metal sheet serves as the piezoelectrically inactive layer, and as one of the electrodes of the device.

A more common form of flexure mode device, known as a bimorph, comprises two layers of piezoelectric material arranged so that when one layer expands, the other contracts, thereby producing more deflection for a given applied field. Since there are two piezoelectrically active layers of material in the bimorph, as opposed to one in the unimorph, the bimorph may be expected to perform twice as well as the unimorph.

For further information on the structural details of prior art flexure mode piezoelectric devices, see the Article by C. P. Germano entitled "Flexure Mode Piezeoelectric Transducers", IEEE Transactions on Audio and Electroacoustics, Vol. Au-19, No. 1, March, 1971.

In some applications proposed for piezoelectric flexure mode devices, e.g., laser scanners and visual displays, relatively large deflections and fast response times are required of the flexure mode devices. A figure of merit, useful for comparing the suitability of different flexure mode devices in such applications requiring both large deflections and high speed, is defined as the DC (i.e. very low frequency) deflection of the device times the first resonant frequency of the device and is called the Deflection Bandwidth Product (DBWP).

Recently, piezoelectric polymeric materials such as polyvinylidene fluoride ($PVF_2$) have received considerable attention for use in various applications. Although the piezoelectric constant $d_{31}$ (a constant that specifies the amount of strain in the plane of a sheet of piezoelectric material produced by an electric field perpendicular to the plane) in this material is considerably lower than that of a ceramic piezoelectric material such as PZT, the DBWP for a flexure mode device made with $PVF_2$ is higher than the DBWP for such a device made with PZT. Hence, flexure mode devices made with polymeric piezoelectric materials are prime candidates for applications requiring large deflections and fast response. Another factor making polymeric piezoelectric materials very attractive, is their plastic properties, since well developed plastics manufacturing technology can be readily adapted to the economical manufacture of polymeric piezoelectric devices.

In making a polymeric piezoelectric flexure mode device, the "unimorph" construction is attractive because of its structural simplicity. On the other hand, the bimorph construction is desirable because of its better performance. One of the problems with either construction, however, is bonding the layers of piezoelectric polymeric material to each other, or to a metal sheet. Problems have been encountered both in achieving sufficient adhesion of the bonding material to the polymeric material and the metal, and in matching the mechanical impedance of the bonding material with that of the polymeric piezoelectric material.

An improper impedance match, or a faulty bond impairs the efficiency of the flexure mode device. The problem faced by the inventors therefore was to provide an efficient, simple, flexure mode device, capable of producing relatively large deflections and having a relatively fast response time, using polymeric piezoelectric material.

SOLUTION—SUMMARY OF THE INVENTION

The present inventors have discovered that by tailoring the thickness of the thick electrode in a unimorph, according to the present invention, the performance of the unimorph, as measured by the Deflection Bandwidth Product, can be optimized, and in a preferred embodiment, actually approaches the performance of an ideal bimorph. A piezoelectric flexure mode device according to the present invention comprises: a sheet of polymeric piezoelectric material, poled in a direction parallel with the thickness of the sheet; a thin electrode, being less than about 1% of the total thickness of the device, disposed on one side of the sheet; and a thick electrode, being between about 2% and about 35% of the total thickness of the device, disposed on the other side of the sheet, the thick electrode being of a thickness sufficient to substantially maximize a figure of merit representing the deflection of the device times the first resonant frequency of the device.

According to a further feature of the invention, both the relatively thin and the relatively thick electrodes are deposited on the polymeric piezoelectric material, using a deposition technique such as sputtering, vapor deposition, electroplating, or electroless deposition, thereby solving the problem of bonding the electrodes to the layer of polymeric piezoelectric material.

In a preferred embodiment of the invention, the electrode material is beryllium; the thin electrode is less than about 1% of the thickness of the device, the thick electrode is about 9% of the thickness of the device, whereby the unimorph achieves about 90% of the DBWP performance of an ideal bimorph of equal total thickness.

In an alternative embodiment, the electrode material is aluminum, the thin electrode is less than about 1% of the total thickness of the flexure mode device; the thick electrode is about 17% of the thickness of the flexure mode device; and the electrodes are deposited by vapor deposition, whereby the unimorph achieves about 77% of the performance of an ideal bimorph.

BRIEF DESCRIPTION OF THE DRAWINGS

The invention will be described with reference to the drawings, wherein:

FIG. 2 is a graph showing the DBWP performance versus the % total thickness of the thick electrode for flexure mode devices constructed according to the present invention, for several electrode metals.

DESCRIPTION OF THE PREFERRED EMBODIMENTS

Figure 1:
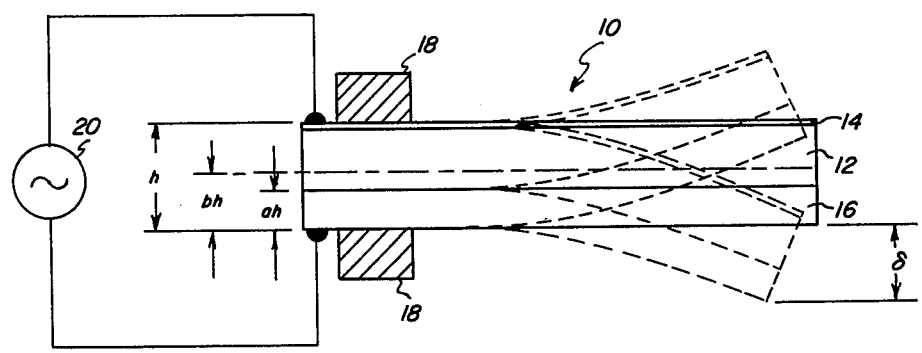
FIG. 1 is a schematic diagram showing a side view of a polymeric piezoelectric flexure mode device according to the present invention.

FIG. 1 is a schematic side view of a piezoelectric flexure mode device according to the present invention. The flexure mode device, generally designated 10, comprises a sheet of polymeric piezoelectric material 12, sandwiched between a thin electrode 14, and a thick electrode 16. Thick electrode 16 doubles as the piezoelectrically inactive layer of a "unimorph", and is tailored, according to the present invention, to a thickness that substantially maximizes the Deflection Bandwidth Product (DBWP) of the flexure mode device. The problem of bonding the thick electrode to the polymeric piezoelectric material is solved, according to the present invention, by depositing the thick electrode on the polymeric piezoelectric material. The term depositing refers herein to any of the well known deposition techniques such as vapor deposition, sputtering, electroplating, or electroless deposition whereby a layer of material is gradually built-up on a substrate.

The flexure mode device 10 is shown mounted as a cantilever bender by clamping one end in a fixture 18. A field of alternating polarity is applied across the piezoelectric material by an AC power supply 20, connected across electrodes 14 and 16. The alternating field across the device causes the device to flex up and down by an amount proportional to the applied voltage. The maximum deflection $\delta$ (see FIG. 1), produced at the tip of the device, is relatively constant, independent of the frequency of the applied field, up to the first resonant frequency of the device, at which point, the deflection increases by more than an order of magnitude. This behavior provides a relatively straightforward way of determining the DBWP of the flexure mode device. The deflection of the device is measured under the influence of relatively low frequency fields, then the frequency is increased until the deflection is observed to abruptly increase, indicating the first resonant frequency. This resonant frequency is multiplied times the low frequency (DC) deflection to arrive at the DBWP.

The present inventors have determined the optimum thickness of the thick electrode to maximize the DBWP of a unimorph bender as follows.

A neutral axis (shown as a dotted line in FIG. 1) is defined by $$b = \tfrac{1}{2}\left[\frac{a^2 C - (1-a)^2}{aC + (1-a)}\right] \qquad (1)$$

where:
  a—is the percentage thickness of the thick electrode; and
  C—is the ratio ($Y_n/Y_p$) of the Young's modulus of the electrode material to the Young's modulus of the polymeric piezoelectric material, and the thin electrode is considered thin enough to be ignored; then the deflection $\delta$ at the tip of the cantilever bender will be:

$$\delta = \frac{3d_{31}EL^2}{2h}\left(\frac{\tfrac{1}{2}[b^2 - (a - b - 1)^2]}{-b^3 - (a - b - 1)^3 + C[(a - b)^3 + b^3]}\right) \qquad (2)$$

where:
  $d_{31}$—is the piezoelectric constant that defines the strain produced in the plane of a sheet of the piezoelectric material by an electric field perpendicular to the plane of the material;
  E—is the applied electric field;
  L—is the length of the bender; and
  h—is the thickness of the flexure mode device;

and the first resonant frequency f is given by:

$$f = \frac{\pi h}{16 L^2}\sqrt{\frac{Y_p}{\rho_p}}\left\{2\sqrt{\frac{[-b^3 - (a-b-1)^3] + C[(a-b)^3 + b^3]}{3[1 - a + Da]}}\right\} \qquad (3)$$

where:
  D—is the ratio ($\rho_n/\rho_p$) of the density of the electrode material to the density of the polymeric material.

The DBWP is given by:

$$DBWP = \delta f = .242 d_{31} E \sqrt{\frac{Y_p}{\rho_p}} \left(\frac{b^2 - (a - b - 1)^2}{\sqrt{\{[-b^3 - (a-b-1)^3] + C[(a-b)^3 + b^3]\}\{1 - a + Da\}}}\right) \qquad (4)$$

For an "ideal bimorph" bender, that is, a bender comprising two sheets of oppositely poled piezoelectric material and zero bonding layer thickness, the DBWP can likewise be calculated.

The deflection at the tip of the "ideal bimorph" is:

$$\delta = (3/2)d_{31}(L^2/h)E \qquad (5)$$

where:
  $d_{31}$—is the piezoelectric constant;
  L—is the length of the bender;
  h—is the thickness of the bimorph; and
  E—is the electric field.

The first resonant frequency of the "ideal bimorph" is found to be:

$$f = 0.162 \sqrt{\frac{Y_p}{\rho_p}} \frac{h}{L^2} \quad (6)$$

where:

$Y_p$—is the Youngs modulus of the piezoelectric material; and $\rho_p$—is the density of the piezoelectric material.

The DBWP is then given by:

$$DBWP = \delta f = 0.242 \sqrt{\frac{Y_p}{\rho_p}} d_{31} E \quad (7)$$

Comparing equation (7) to equation (4) above, it is seen that since the first four terms in equation (4) are identical to equation (7), the expression in brackets in equation (4) is a dimensionless quantity that relates the DBWP of a unimorph to the DBWP of an "ideal bimorph". The quantity in brackets in equation (4), as a function of the percentage thickness of the thick electrode in a unimorph, was calculated for several metals (beryllium, aluminum, copper, and silver) and is shown plotted as a graph in FIG. 2. FIG. 2 shows that when beryllium is used as the thick electrode material, and the thick electrode is about 9% of the total thickness of the device, the performance of a flexure mode device according to the present invention, as measured by the DBWP, is about 90% of that of an "ideal bimorph". This is a truly surprising result since intuitively, it would seem that the unimorph would, at best, perform only about half as well as the "ideal bimorph". Even with aluminum as the thick electrode material, FIG. 2 shows that an electrode thickness of about 17%, yields a performance about 77% of that of an "ideal bimorph".

EXAMPLE

A unimorph flexure mode device was prepared according to the present invention using a 9 μm thick strip of biaxially stretched Kureha KF-1000 brand PVF$_2$, purchased from the Kureha Chemical Company. The PVF$_2$ strip was cleaned and etched prior to electrode deposition using a conventional solvent cleaning process. The strip was rinsed in trichlorethylene for about 2 minutes, then in acetone for about 2 minutes. The PVF$_2$ material was then etched to promote adhesion of the electrodes by immersing the strip in dimethylformamide (DMF) for about 2 minutes. The strip was then rinsed, dried, and placed in a standard vapor deposition chamber, where 500 Å of aluminum were deposited on one side of the strip to form the relatively thin electrode. The strip was then turned over and 6500 Å of aluminum was deposited on the other side of the strip to form a relatively thick electrode having a thickness of about 6% of the total thickness of the device. The piezoelectric material was poled in a field of 0.7 MV/cm for 20 minutes at 80° C., by applying a high voltage across the electrodes while the strip was immersed in a heated oil bath. A portion about 3 mm wide and 35 mm long was cut from the strip and mounted in cantilever fashion as shown in FIG. 1. Under an applied potential of 300 V, a total tip deflection of 0.4 mm was observed, and the first resonant frequency occurred at 190 Hz.

The resulting Deflection Bandwidth Product was 63% of the DBWP of an "ideal bimorph". This point, designated 22, is plotted in FIG. 2 and shows good agreement with the theoretically predicted performance.

As mentioned previously, a more nearly optimum thickness for the thick aluminum electrode would be about 17% of the total thickness of the device or about 18,500 Å. Taking the somewhat arbitrary limit of 60% of the performance of the "ideal bimorph" as the lowest acceptable level of performance to substantially maximize the DBWP of a unimorph, aluminum electrode thicknesses between about 5% and about 37% will produce flexure mode devices having acceptable DBWP's with the preferred thickness being about 17%. Using the same criteria (i.e. 60% of "ideal bimorph" performance), a thick electrode of beryllium between about 2% and about 29% of the total thickness of the device will produce acceptable DBWP's with about 9% total thickness being preferred. For copper, the range is between about 3% and about 20% with about 8% being preferred. And, for silver, the range is from about 5% to about 18% with about 9% being preferred. Thus, for the representative sample of electrode materials for which the DBWP vs. % thickness was calculated, the % thicknesses of the thick electrodes fell within the range between about 2% and about 37%.

The invention has been described in detail with reference to preferred embodiments thereof, however, it will be understood that variations and modifications can be effected within the spirit and scope of the invention. For example, although the material for both the thin and thick electrodes was the same in the disclosed embodiments, different materials could be used for the electrodes (e.g. aluminum for the thin electrode and beryllium for the thick electrode).

Also, although solvent etching was disclosed as a technique employed prior to electrode deposition, other known techniques to promote adhesion of deposited electrodes can be employed, such as corona discharge treatment, or the use of various subbing layers such as disclosed in U.S. Pat. No. 3,912,830, issued Oct. 14, 1975 to Murayama et al. Furthermore, although the preferred embodiments were described with reference to PVF$_2$ as the polymeric piezoelectric material, any other known polymers having piezoelectric properties could be used, e.g. a copolymer of vinylidene fluoride and a monomer polymerizable with vinylidene fluoride, such as tetra fluoroethylene, vinylidene fluorochloride; trifluoroethylene vinyl fluoride, chlorotrifluoroethylene, or propylene hexafluoride.

We claim:

1. A piezoelectric flexure mode device, comprising: a sheet of polymeric piezoelectric material poled in a direction parallel with the thickness of the sheet; a first electrode bonded to one side of said sheet, said first electrode comprising less than 1% of the total thickness of said flexure mode device, and a second electrode bonded to the other side of said sheet, said second electrode comprising between about 2% and about 37% of the total thickness of said flexure mode device, and being of a thickness sufficient to substantially maximize the Deflection Bandwidth Product of the flexure mode device.

2. The invention claimed in claim 1, wherein: said second electrode comprises a layer of beryllium between about 2% and about 29% of the total thickness of said device.

3. The invention claimed in claim 2, wherein: said layer of beryllium is about 9% of the total thickness of said device.

4. The invention claimed in claim 1, wherein: said second electrode comprises a layer of aluminum between about 5% and about 37% of the total thickness of said device.

5. The invention claimed in claim 4, wherein: said layer of aluminum is about 17% of the total thickness of said device.

6. The invention claimed in claim 1, 2, 3, 4 or 5, wherein said electrodes have been bonded to said sheet of polymeric piezoelectric material by depositing the electrodes on said sheet.

7. The invention claimed in claim 6, wherein: said polymeric piezoelectric material is $PVF_2$.

8. A method of making a piezoelectric flexure mode device comprising the steps of:
depositing a first layer of electrode material on one side of a sheet of polymeric piezoelectric material, said first layer comprising less than 1% of the total thickness of said device; depositing a second layer of electrode material on the other side of said sheet of polymeric piezoelectric material, said second layer being of a thickness sufficient to substantially maximize the Deflection Bandwidth Product of the device, and comprising between about 2% and about 37% of the total thickness of said flexure mode device; and poling said polymeric piezoelectric material by applying a voltage across said first and second layers of electrode material sufficient to polarize said piezoelectric material.

9. The invention claimed in claim 8, wherein: said second layer of electrode material comprises beryllium between about 2% and about 29% of the total thickness of said device.

10. The invention claimed in claim 9, wherein: said layer of beryllium is about 9% of the total thickness of said device.

11. The invention claimed in claim 8, wherein: said second layer of electrode material comprises aluminum between about 5% and about 37% of the total thickness of said device.

12. The invention claimed in claim 11, wherein: said layer of aluminum is about 17% of the total thickness of said device.

13. The invention claimed in claim 8, 9, 10, 11, or 12, wherein: said layers of electrode material are deposited by vapor deposition.

14. The invention claimed in claim 13, further comprising the step of solvent etching the polymeric piezoelectric material prior to the step of depositing the first layer of electrode material.

15. The invention claimed in claim 8, 9, 10, 11, or 12, wherein: said sheet of polymeric piezoelectric material is $PVF_2$.

* * * * *